(12) United States Patent
Lee et al.

(10) Patent No.: US 10,608,095 B2
(45) Date of Patent: Mar. 31, 2020

(54) ELECTRONIC DEVICE BASED ON BLACK PHOSPHOROUS SINGLE CHANNEL WITH MULTI-FUNCTION AND METHOD OF MANUFACTURING THE SAME

(71) Applicant: Research & Business Foundation Sungkyunkwan University, Suwon-si (KR)

(72) Inventors: Sungjoo Lee, Seongnam-si (KR); Jingyuan Jia, Suwon-si (KR); Sumin Jeon, Suwon-si (KR); Jin-Hong Park, Hwaseong-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/044,918

(22) Filed: Jul. 25, 2018

(65) Prior Publication Data
US 2019/0097014 A1 Mar. 28, 2019

(30) Foreign Application Priority Data
Jul. 26, 2017 (KR) ........................ 10-2017-0094933

(51) Int. Cl.
| | |
|---|---|
| *H01L 29/49* | (2006.01) |
| *H01L 29/47* | (2006.01) |
| *H01L 29/786* | (2006.01) |
| *H01L 31/0352* | (2006.01) |
| *H01L 29/78* | (2006.01) |

(Continued)

(52) U.S. Cl.
CPC .......... *H01L 29/4916* (2013.01); *H01L 29/24* (2013.01); *H01L 29/47* (2013.01); *H01L 29/66356* (2013.01); *H01L 29/66742* (2013.01); *H01L 29/66969* (2013.01); *H01L 29/7391* (2013.01); *H01L 29/7839* (2013.01); *H01L 29/7846* (2013.01); *H01L 29/78606* (2013.01); *H01L 29/78681* (2013.01);

(Continued)

(58) Field of Classification Search
CPC .......... H01L 29/1606; H01L 29/66356; H01L 29/66045; H01L 29/7931; H01L 29/66742; H01L 29/24; H01L 29/4916; H01L 29/47; H01L 29/78696; H01L 31/111

See application file for complete search history.

(56) References Cited

PUBLICATIONS

Saptarshi Das, A Small Signal Amplifier Based on Ionic Liquid Gated Black Phosphorous Field Effect Transistor, Jun. 2015, IEEE Electron Device Letters, vol. 36, No. 6, pp. 621-623 (Year: 2015).*

* cited by examiner

Primary Examiner — Tucker J Wright
(74) Attorney, Agent, or Firm — NSIP Law

(57) ABSTRACT

The present disclosure provides a multi-functional electronic device with a black phosphorous-based single channel, wherein the device comprises: a black phosphorous-based single channel layer including a horizontal arrangement of a first semiconductor region and a second semiconductor region to define a horizontal junction therebetween, wherein the second semiconductor region has a lower hole-carrier density than the first semiconductor region; a first electrode connected to the first semiconductor region; a second electrode spaced from the first electrode and connected to the second semiconductor region; an ionic gel layer disposed on the first semiconductor region; and a gate electrode for receiving a gate voltage to generate an electric field in the channel layer.

16 Claims, 13 Drawing Sheets

(51) Int. Cl.
*H01L 31/108* (2006.01)
*H01L 29/739* (2006.01)
*H01L 29/66* (2006.01)
*H01L 29/24* (2006.01)
*H01L 29/778* (2006.01)

(52) U.S. Cl.
CPC .. *H01L 29/78696* (2013.01); *H01L 31/03529* (2013.01); *H01L 31/108* (2013.01); *H01L 29/778* (2013.01)

ELECTRONIC DEVICE BASED ON BLACK PHOSPHOROUS SINGLE CHANNEL WITH MULTI-FUNCTION AND METHOD OF MANUFACTURING THE SAME

CROSS-REFERENCE TO RELATED APPLICATIONS

The present application claims, under 35 U.S.C. § 119(a), priority to Korean Patent Application No. 10-2017-0094933 filed on Jul. 26, 2017 in the Korean Intellectual Property Office, the disclosure of which is hereby incorporated by reference in its entirety.

BACKGROUND

1. Technical Field

The present disclosure relates to a black phosphorous-based electronic device and a method for manufacturing the device. More particularly, the present disclosure relates to a multi-functional black phosphorous-based electronic device with a junction structure formed in a black phosphorous-based single channel using partial doping, and a method for manufacturing the device.

2. Related Art

Recently, black phosphorous (BP) has been rediscovered as a material for a stacked two-dimensional semiconductor. BP will be useful as an active material for nanoscale devices in the future. The rapidly growing interest in BP has focused primarily on ultra-thin-film or 2D forms. A major advantage of 2D BP compared to graphene is that it has a natural bandgap, thereby enabling the fabrication of various electronic devices such as transistors. The electrical properties of atomic thin BP may be controlled by external gating or chemical doping. The chemical doping stable in an atmospheric condition is essential to control a carrier concentration and electrical properties of the semiconductor material.

Various homo-junctions, hetero-junctions and complex devices based on 2D materials have been provided using various chemical doping processes. Surface charge doping as a simple approach without the introduction of significant defects has been extensively used to control the chemical and electrical properties of 2D materials. In the transition metal dichalcogenide (TMDC), such as $MoS_2$ and $WS_2$, chemical doping of potassium, benzylbiozene, chlorine, $NO_2$ and DNA has been extensively used for the generation of charge carriers in 2D materials. Relatively little research has been done on successful BP doping methods.

Among these studies, surface adsorbed cesium carbonate ($Cs_2CO_3$) and molybdenum trioxide ($MoO_3$) have been introduced onto the BP surface as donors and acceptors to achieve a controllable doping effect. However, this approach is limited to a low doping regime. Control of charge carriers in a wide manner (from non-degenerate to degenerate doping levels) is an important issue in developing electromagnetic functions in BP applications.

Previously, charge carrier doping into BPs as coupled with electrostatic gating has been reported. In this connection, the doping level is controlled up to the electric region. However, in spite of its practical importance, the conventional doping methods have limitations in that the effect thereof is made only in a non-degenerate range. A wide range of doping onto the thin atomic BP has not yet been well studied. In a reported BP-based diode, the diode operates only when a gate voltage is applied, but the diode function is lost immediately when there is no gate voltage.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide an electronic device using a single channel, in which a channel layer is formed by doping ionic liquid onto a black phosphorous layer to create a wide charge density.

Another purpose of the present disclosure is to provide a method for manufacturing a black phosphorous-based electronic device, in which the method includes executing doping onto a black phosphorous layer using electrostatic doping stable in air to produce a wide charge density from a non-degenerate level to a degenerate level.

The purposes of the present disclosure are not limited to the above-mentioned purposes, and, rather, other purposes and advantages of the present disclosure, as not mentioned above, may be understood from the following descriptions. Other objects and advantages will be more clearly understood by reference to the embodiments of the present disclosure. Further, it will be readily appreciated that these objects and advantages of the present disclosure may be realized by features and combinations thereof recited in the claims.

In one aspect of the present disclosure, there is provided a multi-functional electronic device with a black phosphorous-based single channel, wherein the device comprises: a black phosphorous-based single channel layer including a horizontal arrangement of a first semiconductor region and a second semiconductor region to define a horizontal junction therebetween, wherein the second semiconductor region has a lower hole-carrier density than the first semiconductor region; a first electrode connected to the first semiconductor region; a second electrode spaced from the first electrode and connected to the second semiconductor region; an ionic gel layer disposed on the first semiconductor region; and a gate electrode for receiving a gate voltage to generate an electric field in the channel layer.

In one implementation of the device, a hole-carrier density of the first semiconductor region is adjusted with doping to be in a range of $10^{11}$ $cm^{-2}$ to $10^{13}$ $cm^{-2}$.

In one implementation of the device, the higher a hole-carrier density of the first semiconductor region, the higher a concentration of an ionic compound in the ionic gel layer.

In one implementation of the device, the ionic gel layer has a structure in which an ionic compound is disposed in a matrix formed by a polymer compound.

In one implementation of the device, the polymer compound is PMMA (polymethyl methacrylate), wherein the ionic compound contained in the ionic gel layer is [1-ethyl-3-methylimidazolium bis(trifluoromethanesulfonyl) imide (EMIM:TFSI)].

In one implementation of the device, the first semiconductor region acts as a $P^+$ region, while the second semiconductor region acts as a P region, N region or $N^+$ region depending on gating of the gate electrode.

In one implementation of the device, the device acts as a $P^+$-P junction photodiode, wherein the first semiconductor region acts as a $P^+$ region while the second semiconductor region acts as a P region; or wherein the device acts as a P⁺-N junction photodiode, wherein the first semiconductor region acts as a P⁺ region while the second semiconductor region acts as a N region.

In one implementation of the device, the device acts as a tunneling device exhibiting negative differential resistance (NDR) characteristic at a room temperature, wherein the first semiconductor region acts as a P⁺ region while the second semiconductor region acts as a N⁺ region.

In another aspect of the present disclosure, there is provided a method for manufacturing a multi-functional electronic device with a black phosphorous-based single channel, wherein the electronic device includes a channel layer, two electrodes spaced apart from the channel layer, and a gate electrode for generating an electric field in the channel layer, wherein the method comprises forming the channel layer, wherein forming the channel layer includes: forming a black phosphorous layer; disposing a mask pattern on a first region of the black phosphorous layer; and applying a mixture containing an ionic compound on a second region of the black phosphorous layer not covered by the mask pattern, thereby to electrostatically-dope the ionic compound onto the second region of the black phosphorous layer.

In one implementation of the method, the electrostatically-doping is carried out such that the first region acts as a first semiconductor region while the second region acts as a second semiconductor region, wherein the second semiconductor region has a higher hole-carrier density than the first semiconductor region.

In one implementation of the method, the electrostatically-doping is carried out such that an ionic gel layer containing the ionic compound is formed on the second semiconductor region.

In one implementation of the method, the ionic compound is [1-ethyl-3-methylimidazolium bis(trifluoromethanesulfonyl) imide (EMIM:TFSI)], wherein the mixture further contains polymethyl methacrylate (PMMA), wherein the PMMA is mixed with the ionic compound to form the mixture.

In one implementation of the method, the electrostatically-doping is carried out to define an electrostatically-doped black phosphorous layer with a hole-carrier density in a range of $10^{11}$ cm$^{-2}$ to $10^{13}$ cm$^{-2}$.

In one implementation of the method, the electrostatically-doping includes: forming an electric double layer and a trap site by allowing the ionic compound in the mixture to be absorbed on a surface of the black phosphorous layer; and inducing charge accumulation in an interface between the mixture and the black phosphorous layer.

In one implementation of the method, the mask pattern is made of polymethyl methacrylate (PMMA).

In one implementation of the method, the electrostatically-doping is carried out such that as a concentration of the ionic compound in the mixture increases, a hole-carrier concentration on the second region increases.

As for the black phosphorous-based electronic device according to the present disclosure described above, and the method for manufacturing the device according to the present disclosure described above, providing the black phosphorous layer chemically-doped to control the charge carriers in a wide range (ranging from a non-degenerate doping level to a degenerate doping level) may allow the electrical properties of the black phosphorous-based channel layer to be controlled between the semiconductor property and the conductor property. The black phosphorous layer doped in this way may achieve a uniform horizontal junction structure in a single channel. As such, the present device has a unique variety of functionality (P⁺-P (M-S junction), P⁺-N (PN junction) and P⁺-N⁺ junction (providing technically significant negative differential resistance (NDR) in the I-V characteristic). The black phosphorous-based electronic device with this electrical characteristic may offer the possibility of extending the application range of the nano-sized electronic device in the future. As a result, the present device may overcome the limitations of the conventional device structures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTIONS

Figure 1A:
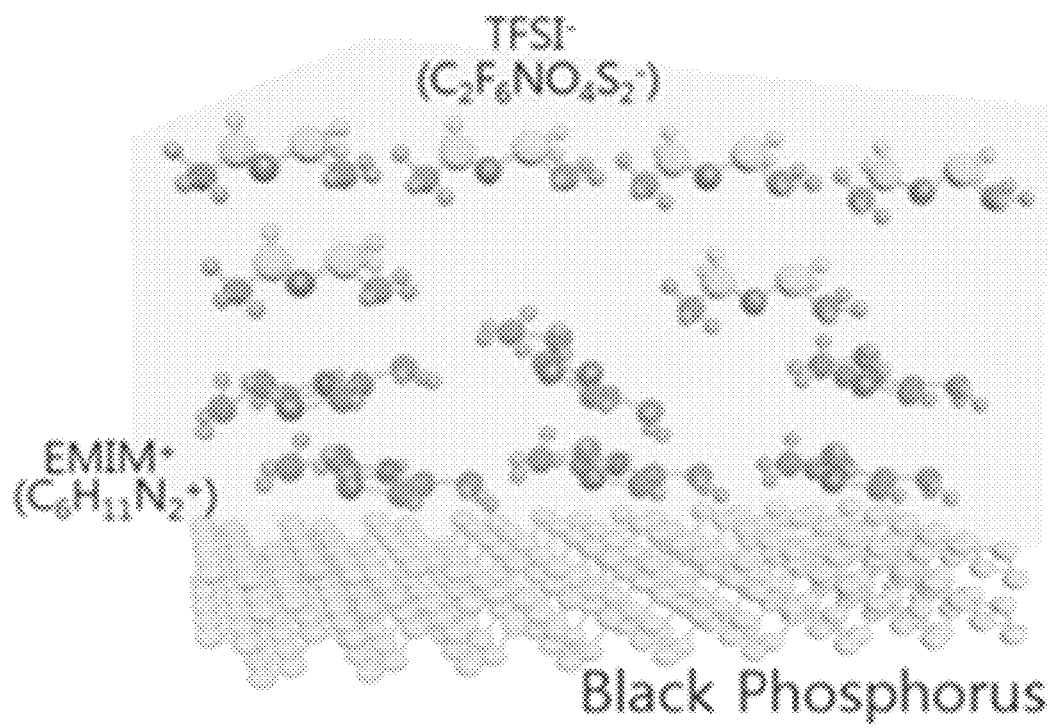
FIGS. 1A to 1H show a structure, and characteristic evaluation results of a black phosphorous-based electronic device according to one embodiment of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

A black phosphorous-based electronic device according to the present disclosure comprises: a black phosphorous-based single channel layer including a horizontal arrangement of a first semiconductor region and a second semiconductor region to define a horizontal junction therebetween, wherein the second semiconductor region has a lower hole-carrier density than the first semiconductor region; a first electrode connected to the first semiconductor region; a second electrode spaced from the first electrode and connected to the second semiconductor region; an ionic gel layer disposed on the first semiconductor region; and a gate electrode for receiving a gate voltage to generate an electric field in the channel layer.

The first semiconductor region in the channel layer is a region having a first semiconductor characteristic by doping ionic liquid onto a two-dimensional black phosphorous layer in a first region thereof. For example, the first semiconductor region may be a $P^+$ region. A hole-carrier density of the first semiconductor region may be in a range of from a degenerate doping level of $10^{13}$ $cm^{-2}$ to a non-degenerate doping level of $10^{11}$ $cm^{-2}$.

The ionic gel layer disposed on the first semiconductor region of the channel layer may be made of a remaining ionic compound thereon after applying an ionic compound onto the first region to define the first semiconductor region. To form the first semiconductor region, ionic liquid may be used as the ionic compound for the doping effect on the black phosphorous layer. The ionic liquid may be a liquid formed by melting ionic crystals each composed of a bond between a cationic portion and an anionic portion. The ionic liquid acts as a surface charge transfer acceptor. The ionic gel layer may have a structure in which the ionic compound is disposed in a matrix formed by a polymer compound.

Examples of the ionic liquid in accordance with the present disclosure may include: cationic EMIM($C_6H_{11}N_2^+$): anionic TFSI($C_2F_6No_4S_2^-$). That is, the ionic liquid may include [1-ethyl-3-methylimidazolium bis(trifluoromethanesulfonyl) imide (EMIM:TFSI)]. A variety of ionic liquids may be implemented depending on the types of cationic portion and anionic portion. The cationic portion may include, by way of example, EIMI, DEME [Diethylmethyl (2-methoxyethyl)ammonium], BMP [1-Butyl-1-methylpyrrolidinium], PP13 [N-Methyl-N-propylpiperidinium], etc. The anionic portion typically includes TFSI.

An example of a polymer compound that constitutes the matrix of the ionic liquid may include polymethyl methacrylate (PMMA). When the ionic compound is applied on the BP layer, the concentration of the ionic compound may be determined by controlling the content ratio between the polymer compound and the ionic compound. Thus, depending on the concentration of the ionic compound, the hole-carrier concentration of the first semiconductor region formed may vary. As the hole-carrier concentration of the first semiconductor region increases, the ionic compound concentration in the ionic gel layer may increase. This may be because in the manufacturing process, the higher the concentration of the ionic compound-containing mixture, the higher the hole-carrier concentration of the first semiconductor region, resulting in the higher ionic compound concentration in the remaining ionic gel layer.

The second semiconductor region may be an un-doped region. Unlike the first semiconductor characteristic of the first semiconductor region, the second semiconductor region has the second semiconductor characteristic, which is a characteristic of the black phosphorous layer itself. A mask layer may be placed on the second semiconductor region. The mask layer may be made of, for example, polymethyl methacrylate (PMMA).

Using a single channel layer that includes the horizontal arrangement of the first semiconductor region and the second semiconductor region and thus includes a horizontal junction defined between them may allow implementing a uniform horizontal junction structure in the single channel. Thus, $P^+$-P (M-S junction) ($P^+$-P diode), $P^+$-N (PN junction) ($P^+$-N diode), $P^+$-$N^+$ ($P^+$-$N^+$ diode, NDR device) junction, etc. may be realized.

The gate electrode is applied with the gate voltage. The gate electrode is insulated from the channel layer. The gate electrode may be disposed to generate an electric field in the channel layer when the gate voltage is applied to the gate electrode. The gate electrode is disposed on the bottom surface of the channel layer and is insulated from the channel layer via a gate insulating layer. Thereby, a bottom gate type may be formed. The gate electrode may be spaced apart from the first electrode and the second electrode. The gate electrode may be disposed to be insulated from the channel layer while overlapping at least partly with the channel layer. The structure of the black phosphorous-based electronic device may be implemented using a variety of known transistor or diode structures.

Figure 1B:
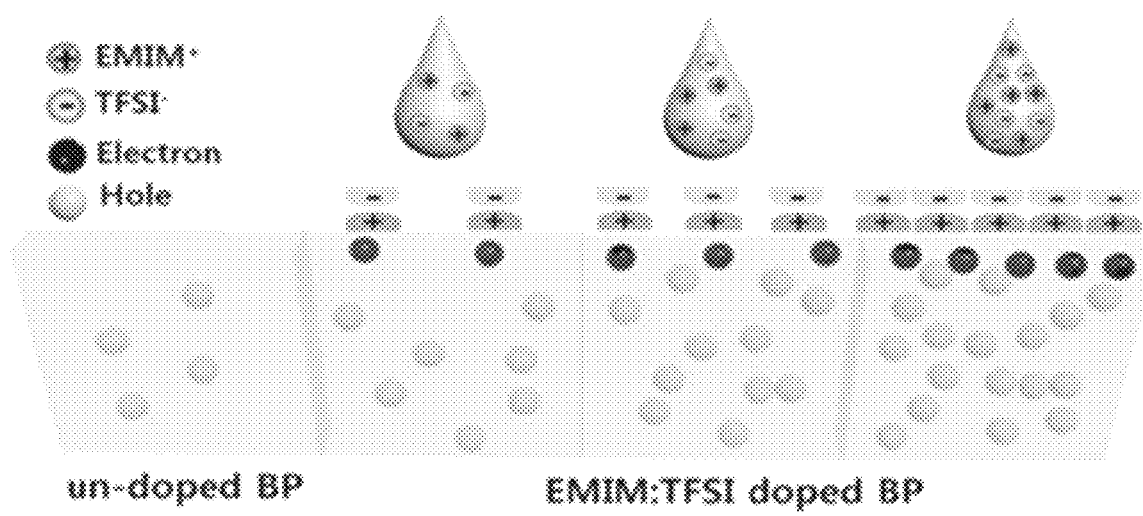

FIGS. 1A to 1H illustrate the structure and characteristic evaluation results of the black phosphorous-based electronic device according to one embodiment of the present disclosure. FIGS. 1A and 1B are schematic views for illustrating doping onto the black phosphorous layer in the black phosphorous-based electronic device.

Referring to FIGS. 1A and 1B, the ionic liquid constituting the ionic gel layer according to one embodiment may be made of a material having a low molecular weight and a high polarizability. When the material contacts another material, the material realizes an extensive charge induction effect. When the ionic liquid is dropped on the surface of the black phosphorous layer, the liquid is absorbed on the surface of the black phosphorous layer to generate an electric double layer and a trap site thereon. This leads to charge accumulation at the interface between them. This results in a P doping effect on the black phosphorous layer surface below the interface with the ionic liquid. The doping level on the black phosphorous layer may also be controlled via the concentration control of the ionic liquid. The concentration of the ionic liquid may be controlled by controlling the mixing ratio of the ionic liquid and PMMA (polymethyl methacrylate). The first semiconductor region may be doped using the ionic liquid so as to have the high hole-carrier density. In the resulting electronic device, the ionic liquid remains as the ionic gel layer.

The black phosphorous-based electronic device having such a channel layer, according to the present disclosure may act as, a diode, in particular, an excellent optical device having strong optical response in a wide wavelength range from IR (infra-red) light to a visible light, which may be applied to various technical fields.

Hereinafter, the electrostatically-doping of the ionic compound in an air-stable manner onto the black phosphorous layer is illustrated which may be controllable to generate a wide ranged charge density from the un-degenerate doping level to the degenerate doping level. Further, the characteristics of the manufactured channel layer will be described in more detail.

Manufacturing Example: Two-dimensional BP Nano Thin Film Acquisition and Thickness Adjustment Thereof Physical thinning from bulk BP crystal was performed using Blue Nitto tape to obtain an atomic BP thin film. The peeled BP thin film or the peeled BP flake was transferred onto a 285 nm $SiO_2/p^{++}$ silicon wafer. Then, an ICP (inductive coupled plasma) treatment was performed on the obtained BP thin film for a thickness control and surface cleaning process. At this time, a condition for the ICP treatment were as follows: 30 mTorr pressure was maintained while Ar gas was injected, and 350 W RF power was applied at 13.56 MHz for high density plasma discharge.

Manufacturing Example: Preparation of Ionic Liquids with Varying Concentrations

EMIM: TFSI having various concentrations was prepared to control the doping effect. A mixture between EMIM: TFSI 12 mg and 495 PMMA A5 (trade name) 84, 36, 12, 4, and 0 mg led to the ionic liquid mixtures of EMIM: TFSI with weight percentages (concentrations) of 12.5%, 25%, 50%, 75% and 100%. Subsequently, doping was performed on the BP layer by directly dropping the ionic liquid mixture with the appropriate concentration onto the target BP channel location.

Electrostatic Doping Using Ionic Liquid and Result-1 Thereof

Figure 1C:
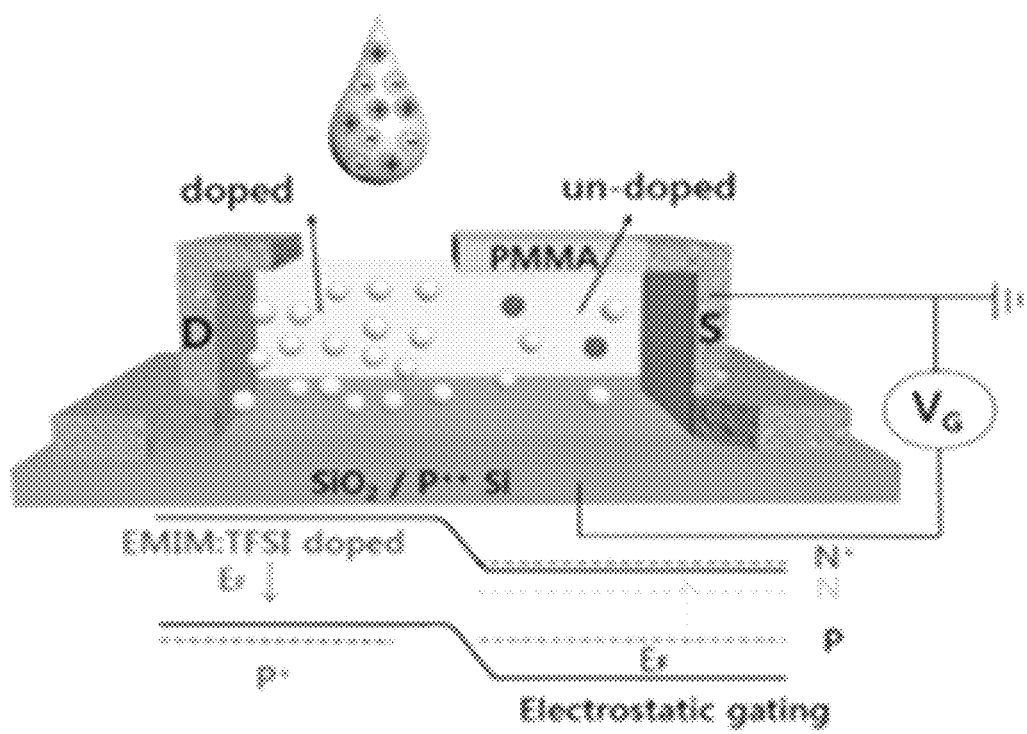

In order to realize a $p^+$-p junction, a $p^+$-n junction, and a $p^+$-$n^+$ junction for the two-dimensional black phosphorous thin film. As shown in FIG. 1C, the un-doped region was passivated with PMMA, while the ionic liquid with a concentration of 100% was dropped on the doped region. For PMMA passivation, PMMA was coated and then the PMMA was patterned using e-beam lithography. As a result, the BP region onto the ionic liquid was applied becomes a $p^+$ state having a high hole-carrier density, while the un-doped BP region may turn into a p, n, or $n^+$ state depending on back gating.

OM (optical microscope) images, Raman spectra, Raman mapping images, Kelvin probe force microscopy (KPFM) mapping images, and XPS (X-ray photoelectron spectra) were obtained for the prepared BP channel. The results are shown in FIGS. 1D and 1H, respectively.

Figure 1D:
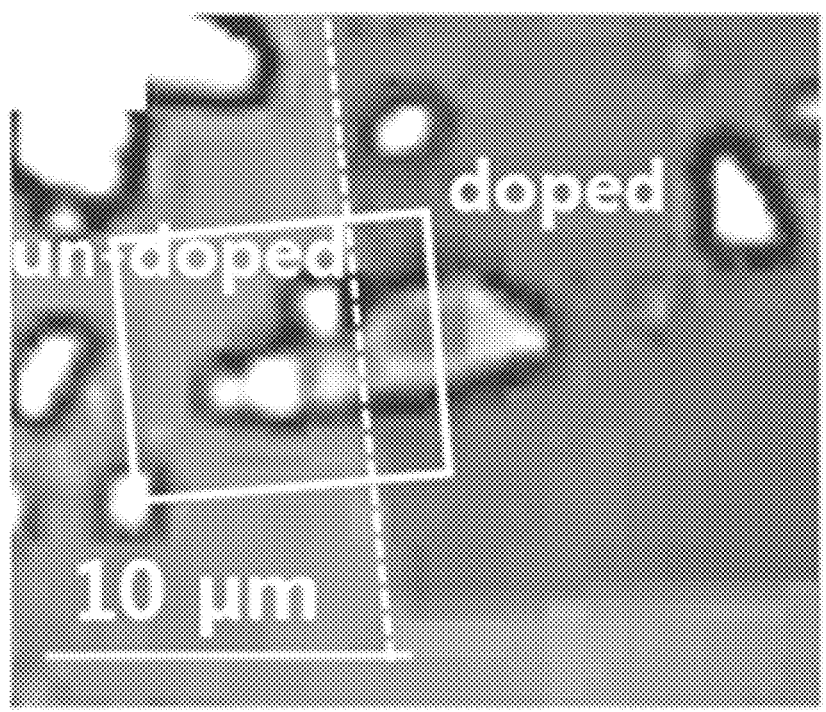
Figure 1E:
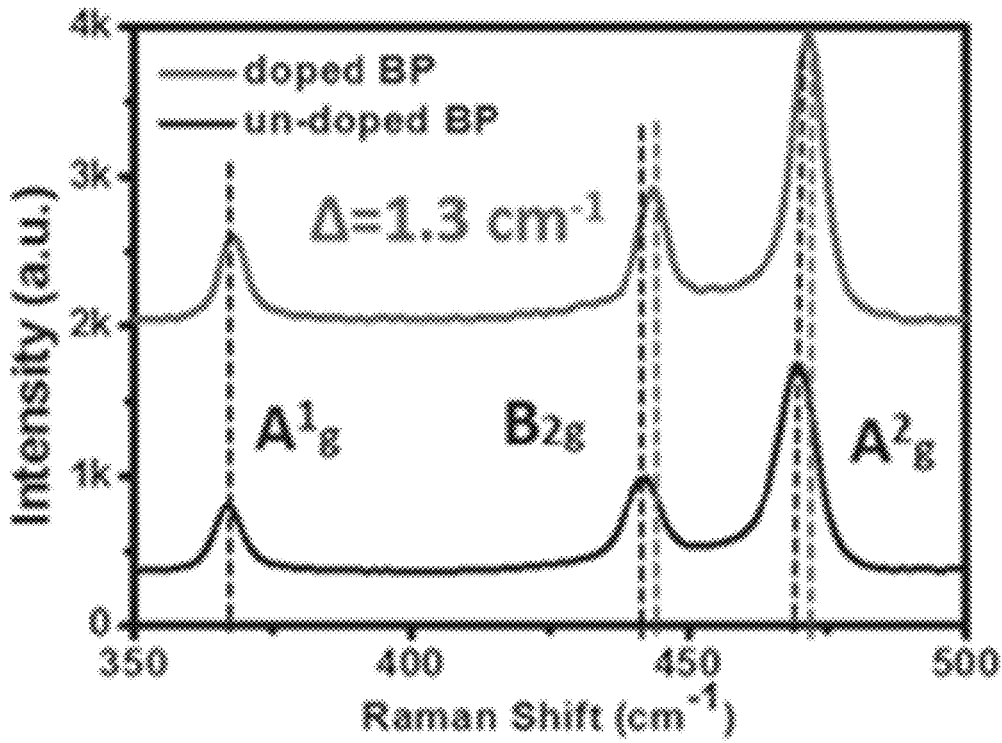
Figure 1F:
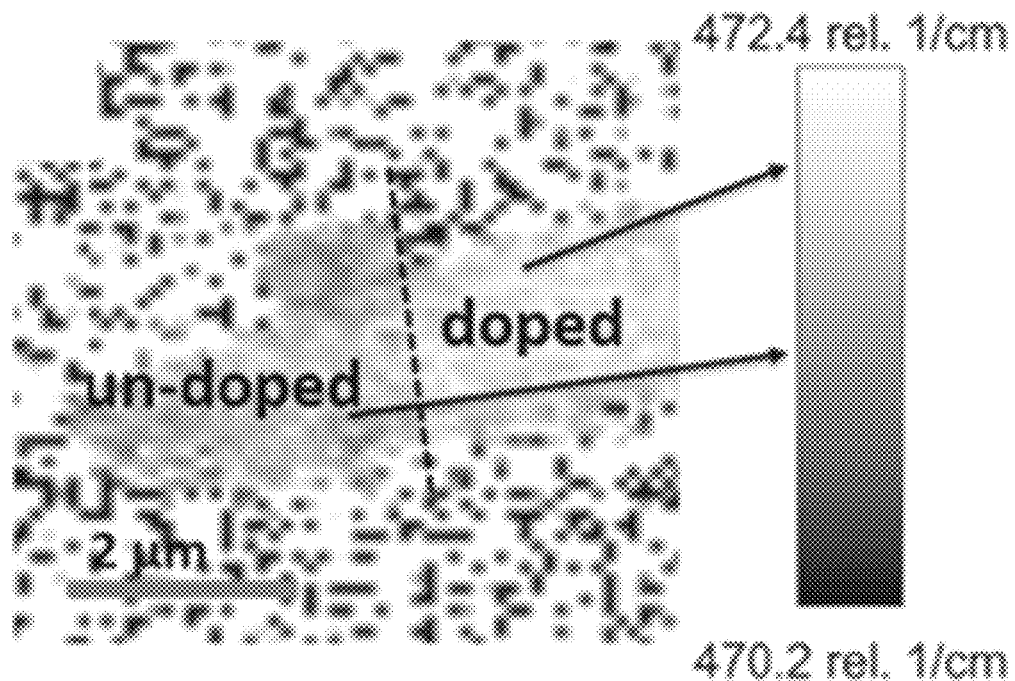
Figure 1G:
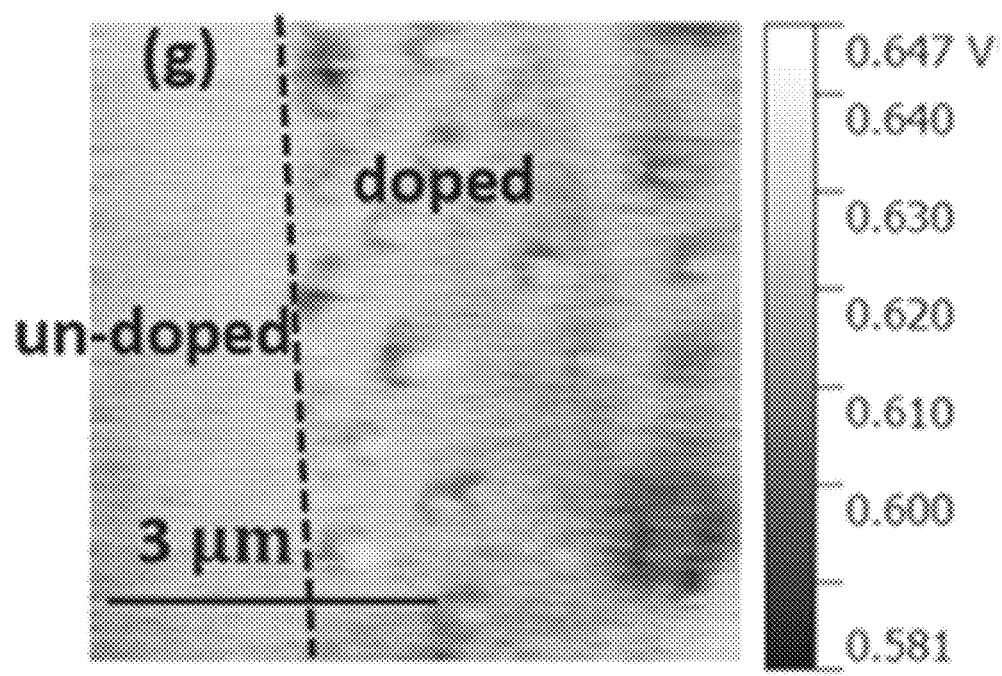
Figure 1H:
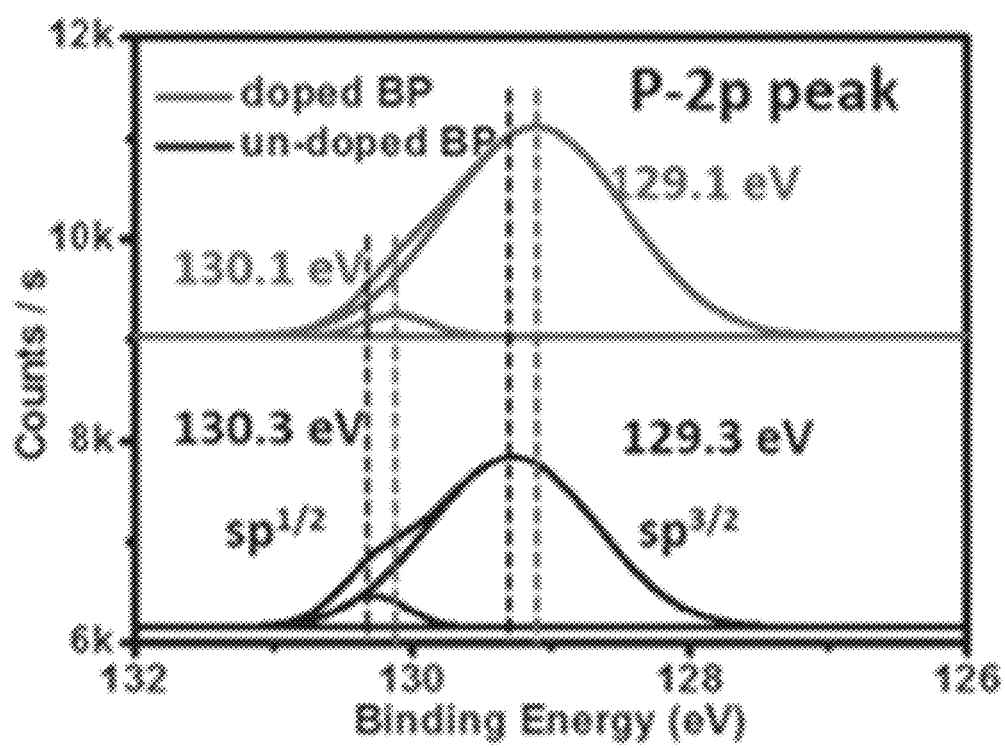

FIG. 1D is an OM image of a BP channel; FIG. 1E is a Raman spectrum before and after the electrostatic doping of EMIM: TFSI; FIG. 1F is an $A^2_g$ peak Raman mapping image of the BP channel; FIG. 1G is a KPFM mapping image of the BP channel; and FIG. 1H shows the result of XPS measurement of the BP channel before and after EMIM: TFSI electrostatic doping.

Referring to FIG. 1D, a white dotted line in the OM image represents a boundary line between the un-doped region and the electrostatically-doped region of the BP channel. As may be seen from the above boundary, a uniform horizontal BP junction may be identified.

Referring to FIG. 1E, the spectrum of the un-doped BP region shows a single peak at 366 cm$^{-1}$ ($A^1_g$) corresponding to vibration out of the plane, and two peaks at 433 cm$^{-1}$ and 471 cm$^{-1}$ ($B^2_g$ and $A^2_g$) corresponding to vibrations in the plane. That is, in the doped BP region with 100% EMIM: TFSI, the hole-carrier density increases. Thus, the peaks of $B^2_g$ and $A^2_g$ shifted to the red peaks (difference 1.3 cm$^{-1}$). This shift is consistent with previous findings on Raman peak changes as observed in doped two-dimensional materials. To the contrary, the peak of $A^1_g$ does not have any shift.

FIG. 1F is a Raman-mapped image of an $A^2_g$ peak center position (a portion represented by a white square in FIG. 1D) as collected from the electrostatically-doped BP sample. A color contrast between mapping images of the un-doped BP region and the electrostatically-doped BP region may clearly confirm that the uniform horizontal junction is formed in the two-dimensional BP thin film.

Referring to FIG. 1G, it may be seen that the surface potential ($\phi$s) mapping images as obtained from the doped and un-doped regions show clear contrasts. The value of $\Delta\Phi$s between the doped and un-doped regions was estimated to be 50 meV. Work functions of 4.28 eV and 4.33 eV were obtained for the un-doped BP and electrostatically-doped BP regions, respectively.

Referring to FIG. 1H, we may identify 2p peaks of phosphorus (P). The P 2p peaks as obtained from the electrostatically-doped BP were shifted to lower values compared to the peaks as obtained from the un-doped BP. In particular, P $2p^{1/2}$ shifted from 130.3 eV to 130.1 eV. P $2p^{3/2}$ was shifted from 129.3 eV to 129.1 eV. The down shift of the XPS peaks was due to the electrostatic doping effect. In this connection, the Fermi level shifted toward the valence band edge due to the electrostatic doping effect. A similar result has been reported for graphene and TMDC.

Although not shown in FIGS. 1A to 1H, the following were confirmed from SAED patterns from TEM images: the electrostatically-doped region has a high-quality monocrystalline structure with an orthorhombic crystal characteristic and little impurities. This may not be inconsistent with the characteristic of un-doped BP.

Further, it has been confirmed from the high resolution TEM image (HRTEM) that the lattice constants as obtained from the doped region and the un-doped region are the same. This may serve as data proving that the electrostatic-doped BP region using the ionic liquid may maintain a unique crystal characteristic and thus the uniform horizontal BP junction may be formed.

Preparation of FET Transistor Samples 1 to 6

Figure 2A:
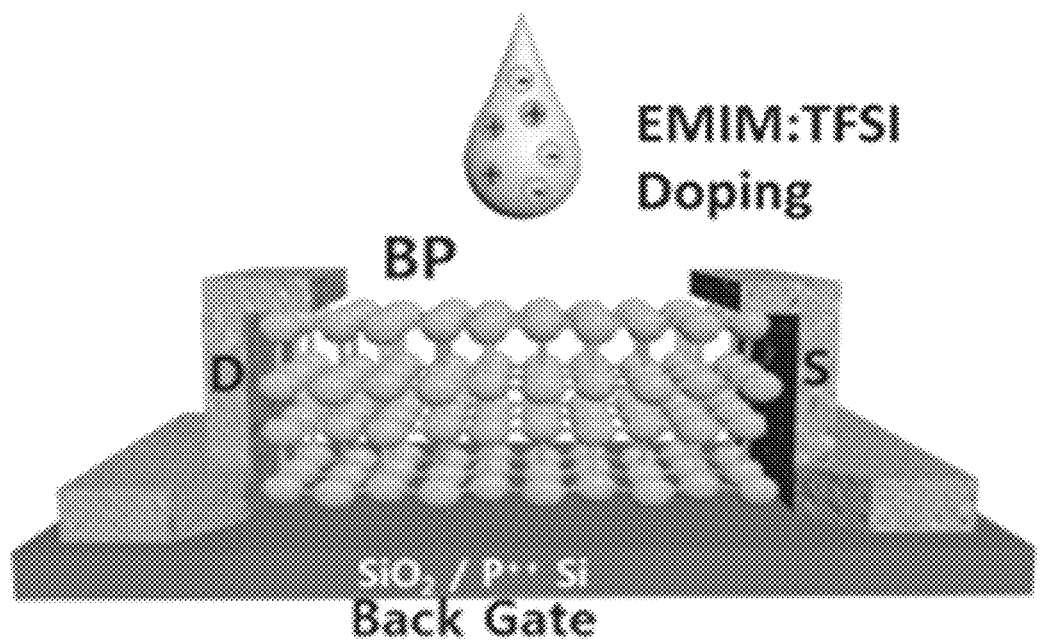
FIGS. 2A to 2D are illustrations of a structure and electrical characteristics of a black phosphorous-based electronic device according to one embodiment of the present disclosure.

In order to confirm the electrostatic doping effect based on the varying concentrations of the ionic liquid, a black phosphorous thin film was transferred onto a 285 nm $SiO_2/p^{++}$ Si substrate using a physical thinning technique and then was subjected to an Ar plasma treatment. Then, an ionic liquid mixture with different concentrations (0%, 12.5%, 25%, 50%, 75%, and 100%) was applied onto the resulting BP film using a drop-cast technique at a room temperature as shown in FIG. 2A. In this connection, a 7 nm BP film was used as a channel. The ionic liquid mixture containing various concentrations (0%, 12.5%, 25%, 50%, 75%, and 100%) of EMIM: TFSI was electrostatically-doped on the resulting BP film to produce back-gating transistor samples 1 to 6. Then, each characteristic thereof was measured. In this connection, the concentration 0% represents the un-doped state. Between measurements, the BP-based device was cleaned using IPA (isopropyl alcohol) and then immersed in an acetone solution for 5 minutes. The results are shown in FIGS. 2B to 2D.

Figure 2B:
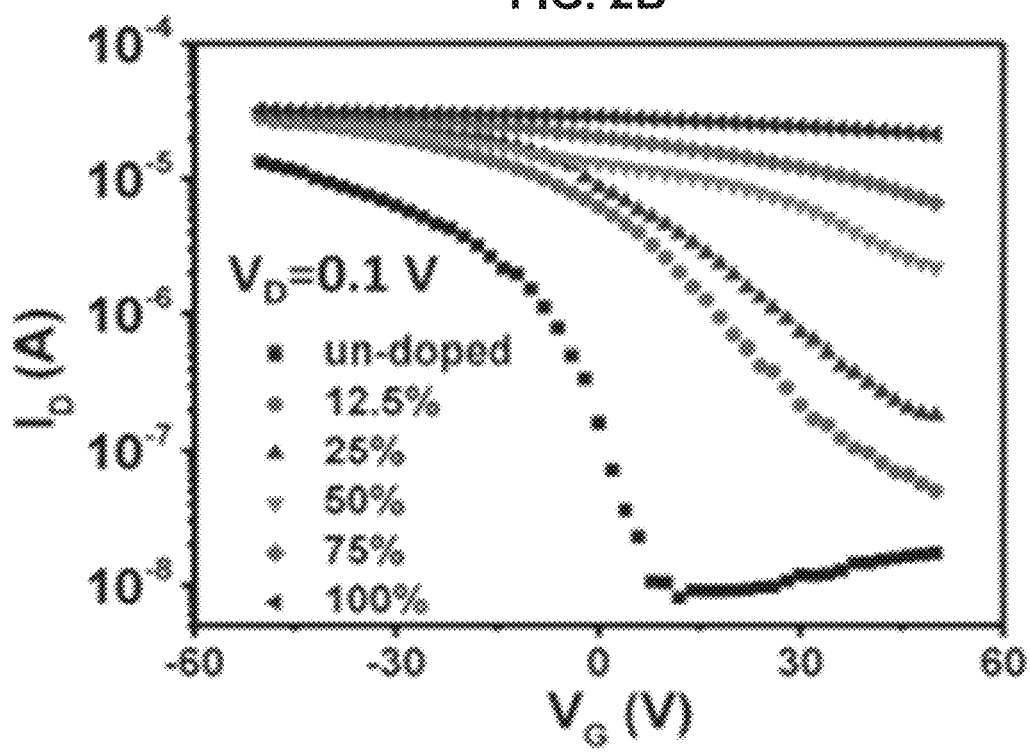

FIG. 2B is a graph showing a current change when the gate voltage is applied to each of the FET transistor samples 1 to 6. FIG. 2C is a graph showing the change in threshold voltage based on the concentration of the ionic liquid mixture. FIG. 2D is a graph showing the change in carrier concentration based on the concentration of the ionic liquid mixture.

Referring to FIG. 2B, it may be confirmed that the transfer curve obtained from an un-doped BP device corresponding to 0% concentration exhibits a p-type dominant transfer behavior with a minimum current value at 8 V. In contrast, in the case of the electrostatically-doped BP using the ionic liquid at 12.5% concentration, the minimum current position was shifted toward the positive value in excess of 50 V. This represents a significant p-type doping on the BP film. For the higher concentrations, namely, 25%, 50%, 75% and 100%, each transfer curve thereof exhibited a typical p-type behavior.

Figure 2C:
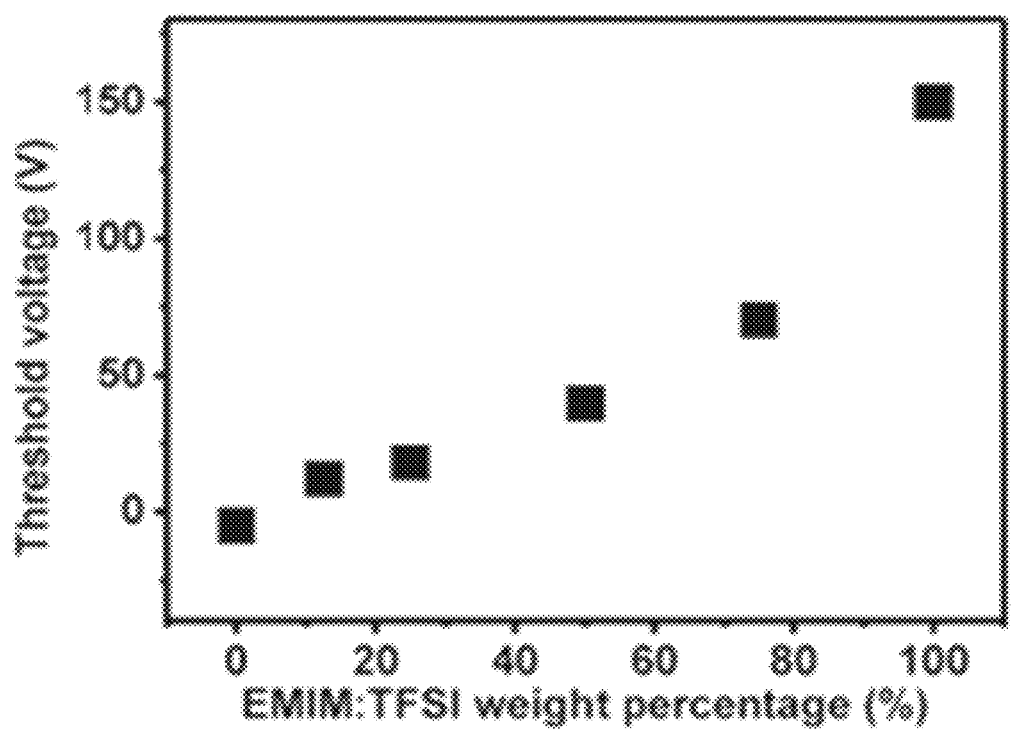
Figure 2D:
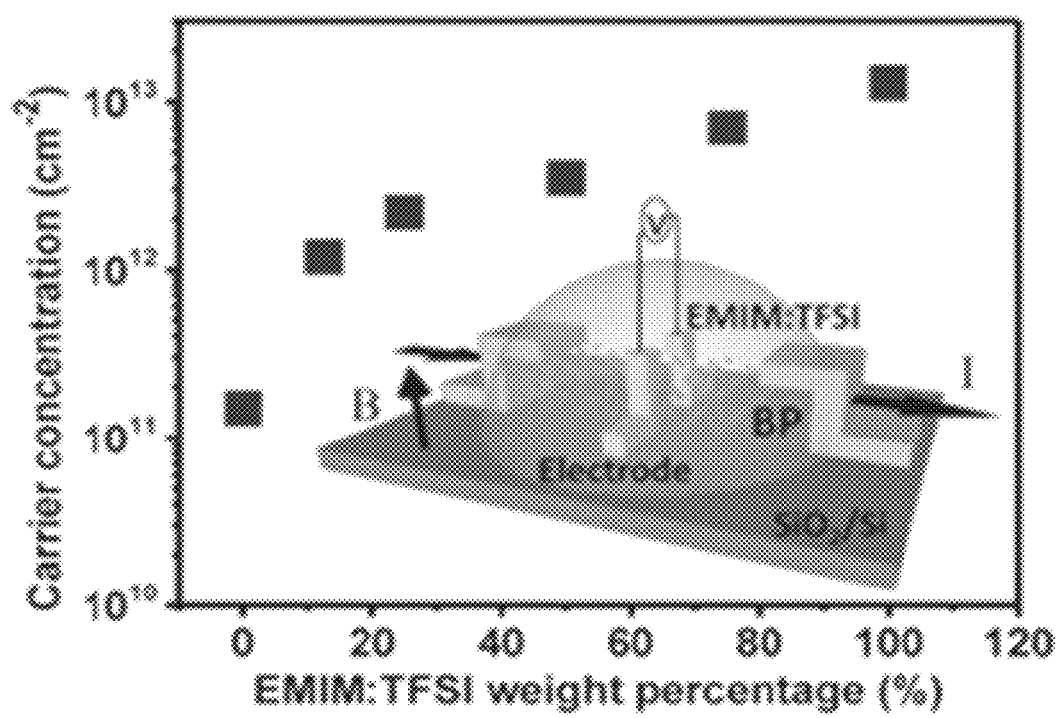

Referring to FIG. 2C, it may be seen that the threshold voltage gradually increases from −5 V (concentration 0%) to 150 V (concentration 100%) as the concentration of the ionic liquid increases. In the case of a BP device electrostatically doped with an ionic liquid having a concentration of 100%, the current value in the BP channel was almost constant. This indicates a typical metallic characteristic. This indicates that controllable electrostatic doping from the un-degenerate level to the degenerate level ($P^+$ doping) has been achieved Although not shown in FIGS. 2A to 2D, the hole-carrier concentration induced by the non-doped BP was measured to be $7\times10^{10}$ cm$^{-2}$ from the transfer curve. As the concentration of the ionic liquid increases, the carrier concentration may gradually increase to $2\times10^{13}$ cm$^{-2}$.

Further, Hall measurements were performed using two opposing contacts placed perpendicular to the drain-source current path (see a schematic diagram inserted in the graph of FIG. 2D). The carrier density was calculated according to Equation 1 below, and the result thereof is shown in FIG. 2D.

$$n_H = IB/eV_H \qquad \text{[Equation 1]}$$

(In Equation 1, $n_H$: carrier concentration, B: vertical magnetic field, $V_H$: horizontal voltage, I: current through BP channel)

Referring to FIG. 2D, as the concentration of the ionic liquid increases from 0% to 100%, the hole-carrier concentration increases from $10^{11}$ cm$^{-2}$ to $10^{13}$ cm$^{-2}$. This indicates that the doping level on the BP may be easily controlled using electrostatic doping of the EMIM: TFSI. That is, the carrier concentration of BP may be widely controlled from $10^{11}$ cm$^{-2}$ (a non-degenerate doping level) to $10^{13}$ cm$^{-2}$ (a degenerate doping level).

This result enabled calculation of the Fermi level position $E_F$ in the BP layer with different doping levels. $E_F$ was calculated using the hole-carrier band effective mass of 0.2 $m_e$ ($m_e$: electron mass in free space). For non-doped BP, the $E_F$ was 1 meV. $E_F$ increased gradually with increasing concentration of the EMIM: TFSI and eventually reached 250 meV for electrostatic doping of 100% concentration of the EMIM: TFSI.

Preparation of BP Junction Device

A partially doped BP junction device was prepared using the ionic liquid mixture (i.e., $p^+$ type) at a 100% concentration using substantially the same method as that as described in FIG. 1C.

Evaluation of Electrical Characteristic of BP Junction Device

For the partially doped BP junction device as prepared above, the I-V characteristic was measured by applying a drain voltage $V_D$ to the $P^+$ doped region. Further, the $I_D$-$V_D$ characteristic was measured and the $I_f/I_r$ ratio (ratio of forward current to reverse current) was measured based on $V_g$. The result is shown in FIGS. 3A to 3C.

Figure 3A:
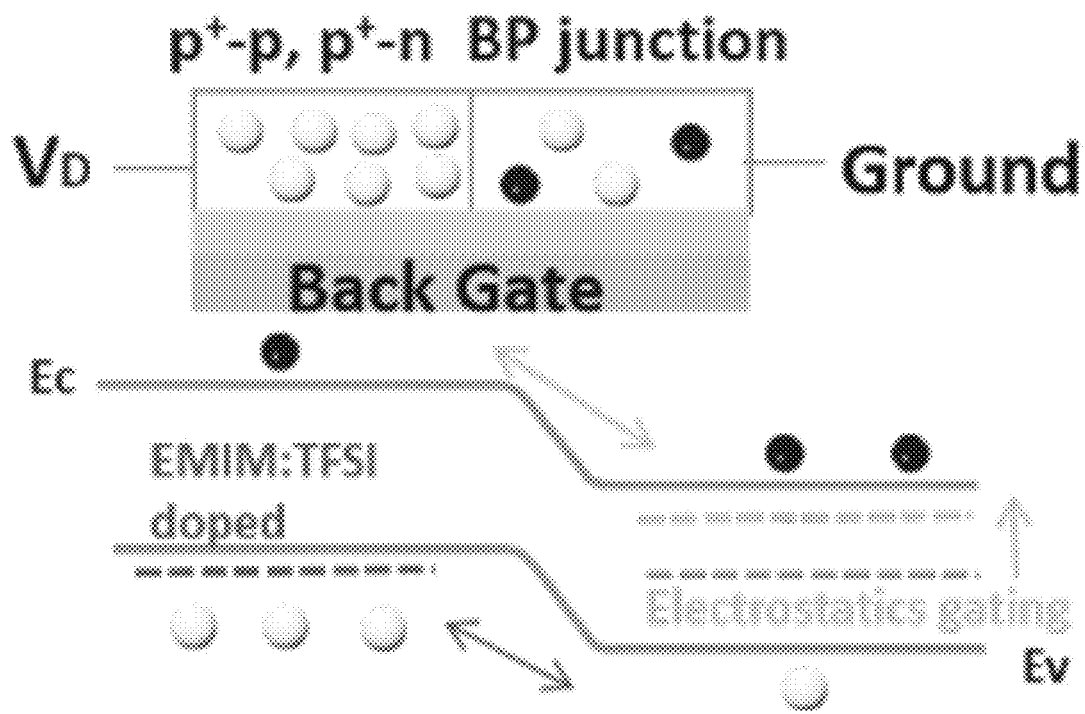
FIGS. 3A to 3C are illustrations of a structure and characteristics of a channel layer of a black phosphorous-based electronic device according to one embodiment of the present disclosure.
Figure 3B:
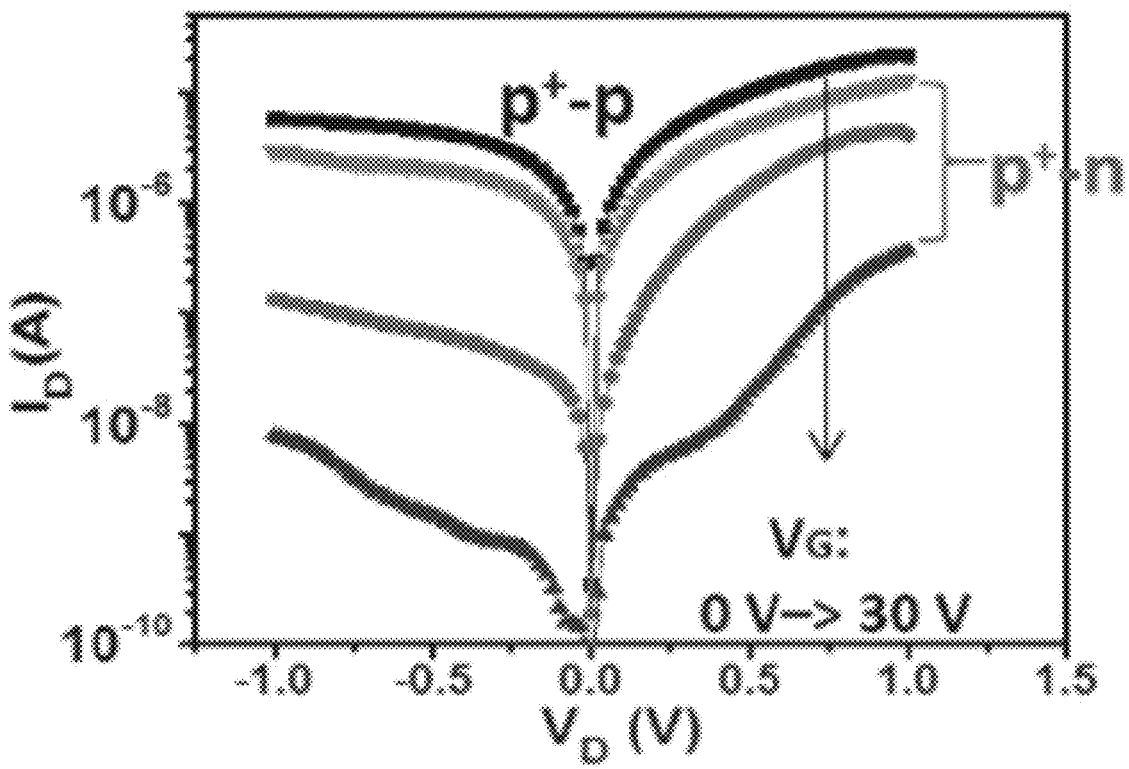
Figure 3C:
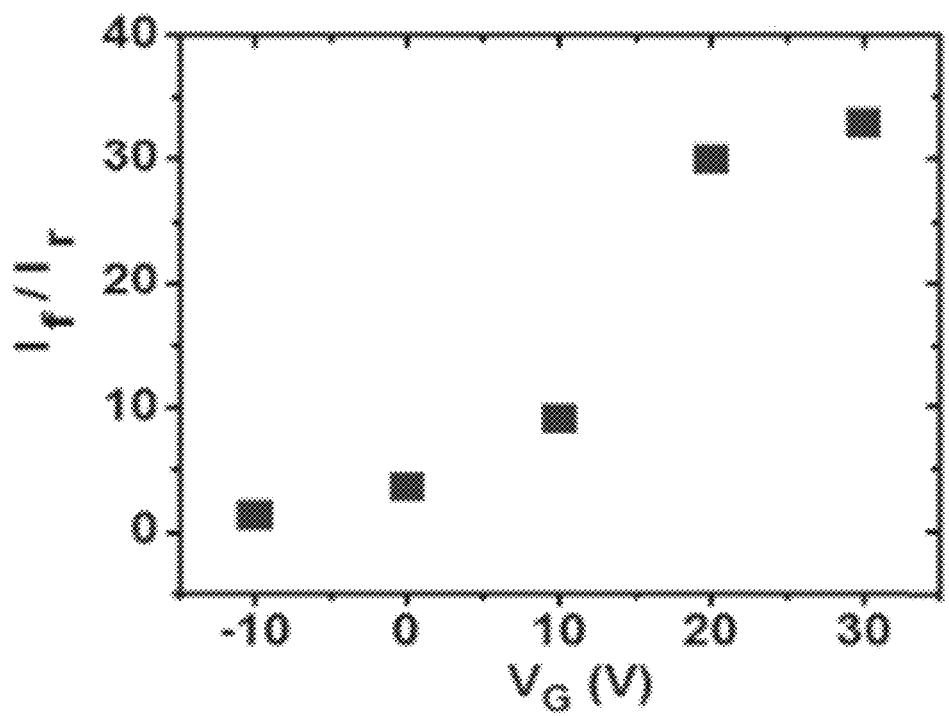

FIGS. 3A to 3C illustrate a structure and characteristics of a channel layer of the black phosphorous-based electronic device according to one embodiment of the present disclosure.

FIG. 3A is a schematic diagram of a structure and an energy band at an equilibrium state of BP based $p^+$-p, and $p^+$-n junction FETs (electric field effect transistors); FIG. 3B shows an $I_D$-$V_D$ characteristic graph at $0<V_g<30$ V for a 7 nm BP FET; FIG. 3C is a graph showing an $I_f/I_r$ ratio based on $V_g$.

Referring to FIGS. 3A and 3B, when $V_D>0$, the hole-carrier moves from the $P^+$ region to the un-doped region. The diode operation when the electrical characteristic of the non-doped BP region changes based on $V_g$ is shown in FIG. 3 (b).

It was confirmed referring to FIG. 3C that as $V_g$ increases from 0 to 30 V, the forward current ($I_f$) and the reverse current ($I_r$) are all reduced due to the built-in potential (BIP) difference. Significant reduction in the reverse current results from stronger internal potential that limits the reverse current. As the back gate voltage varied from 0V to 30V, the obtained $I_f/I_r$ ratio increased from 3.66 to 33. An ideal factor of 1.16 was obtained. This shows a slight carrier recombination in a uniform horizontal junction BP diode. This controllable result via the gating suggests applicability of the present BP device to optical devices.

Optical Characteristic Evaluation

Photocurrent was measured after irradiating light to the two junction devices ($P^+$-P junction device at $V_g=0$V and $P^+$-N junction device at $V_g=30$V). The measured values were compared to those obtained from the non-doped BP channel devices (no junction). In this experiment, light of 655 nm and 1064 nm wavelength was used. The result is shown in FIGS. 4A to 4G.

FIG. 4A to 4G illustrate optical characteristics of the black phosphorous-based electronic device according to one embodiment of the present disclosure.

Figure 4A:
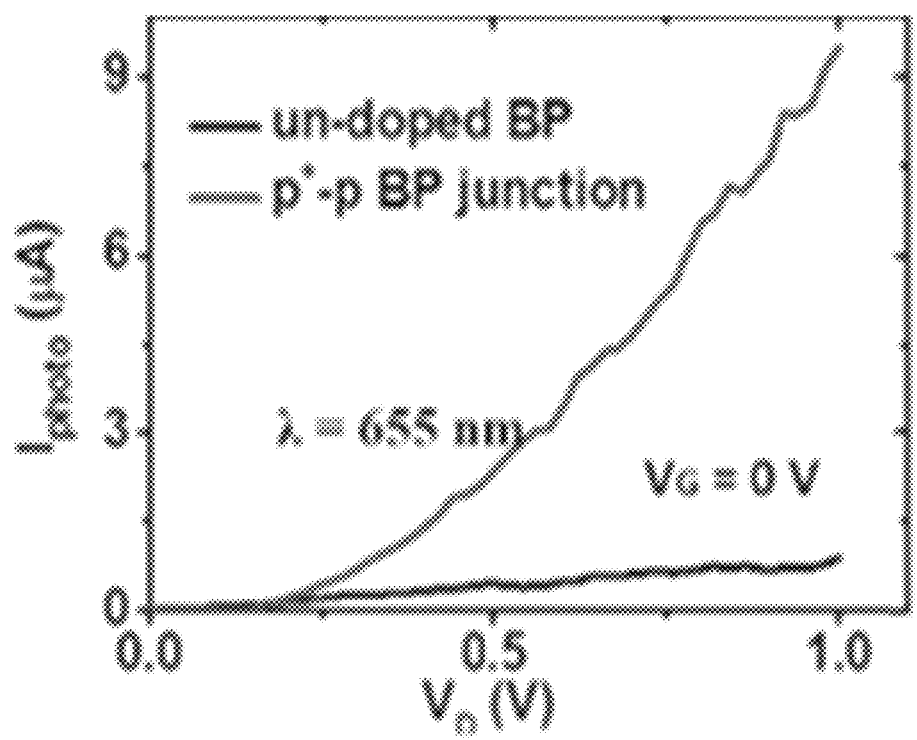
FIGS. 4A to 4G are illustrations of optical characteristics of a black phosphorous-based electronic device according to one embodiment of the present disclosure.
Figure 4B:
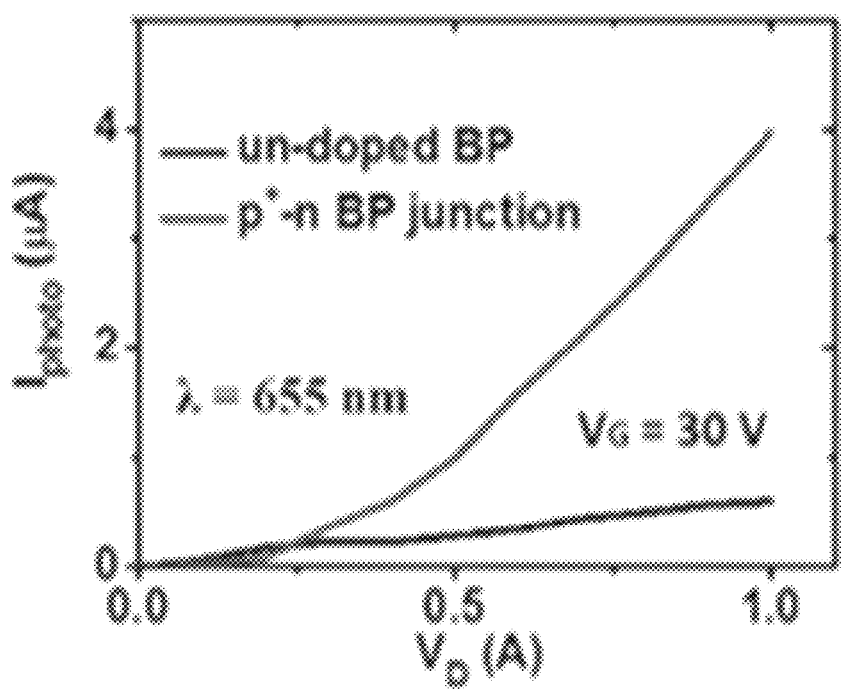

FIG. 4A is an $I_{photo}$-$V_D$ characteristic graph of partially doped BP and non-doped BP at $V_g=0$ V using a 655 nm wavelength laser; FIG. 4B is an $I_{photo}$-$V_D$ characteristic graph of partially doped BP and un-doped BP at $V_g=30$ V using a 655 nm wavelength laser.

Referring to FIGS. 4A and 4B, photocurrent for the junction device was much higher than that obtained from the non-doped BP FET for red light irradiation thereto at a power of 62.5 mW/cm$^2$. For the junction device, the photocurrents for the two devices were respectively 10 μA and 4 μA at the gate voltages of 0V and 30V. The measured values were 10 times higher than those obtained from the non-doped channel.

This photocurrent may be enhanced by effectively removing and promoting the photo-generation from e-h (electron-hole) pairs. Although the internal potential of the $P^+$-N junction is stronger than the internal potential of the $P^+$-P junction, the photocurrent for the $P^+$-N junction was slightly smaller than that for the $P^+$-P junction since the carrier concentration of the $P^+$-P junction is much larger than that of the $P^+$-N junction.

It may be confirmed from each of FIGS. 4A and 4B that for $P^+$-P junction and $P^+$-N junction (red line), a significant photocurrent enhancement may be achieved compared to the photocurrent as measured for the non-doped channel as the non-dope BP (black line).

Figure 4C:
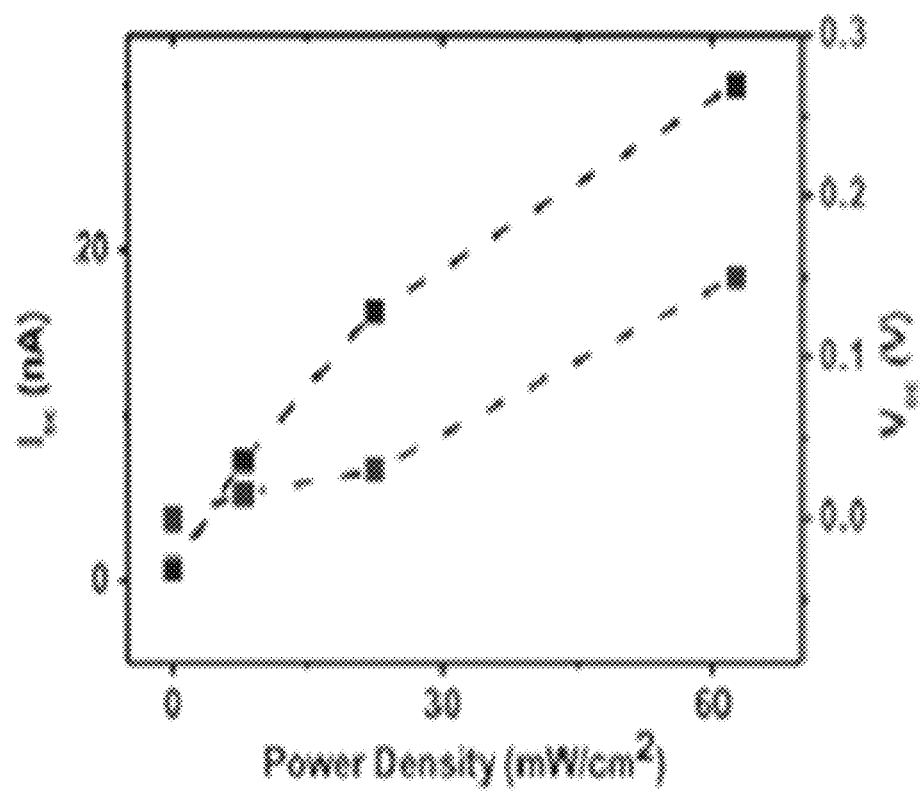

FIG. 4C is a $V_{oc}$ and $I_{sc}$ characteristic graph based on the laser power density for the $P^+$-N junction device. It was confirmed referring to this graph that open-circuit voltage ($V_{oc}$) and short-circuit current ($I_{sc}$) increased with laser power density increase under irradiation of a red laser. It is noted that the open-circuit voltage ($V_{oc}$) and short-circuit current ($I_{sc}$) were 0.15 V and 30 nA, respectively for the $P^+$-N junction at a power of 62.5 mW/cm$^2$. Although not shown in the figure, the open-circuit voltage ($V_{oc}$) and short-circuit current ($I_{sc}$) were 0.1 V and 80 nA for $P^+$-P junction, respectively. This tendency was not observed in the non-doped BP channel due to the absence of internal potential.

Figure 4D:
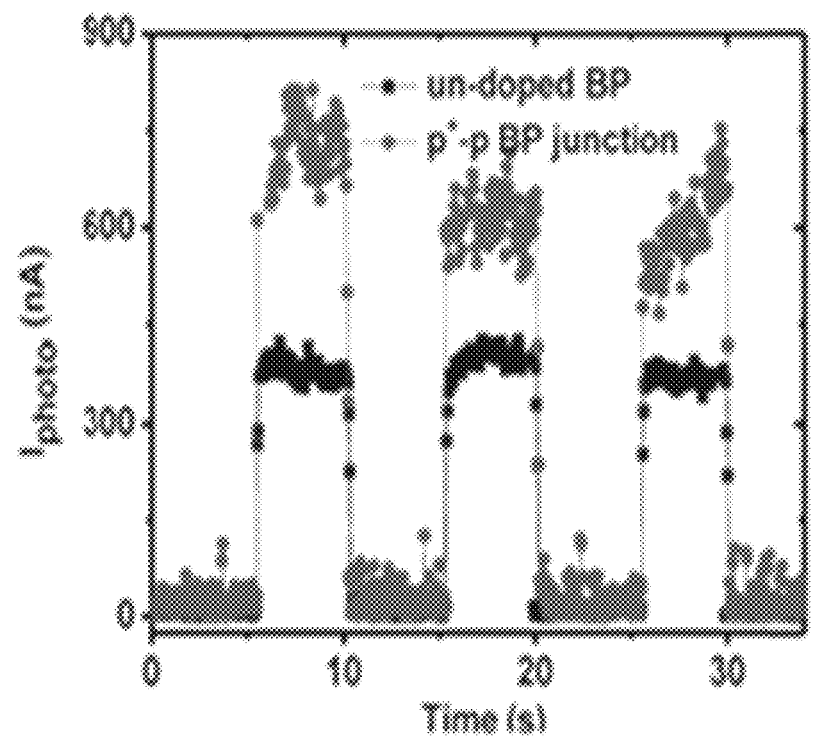
Figure 4E:
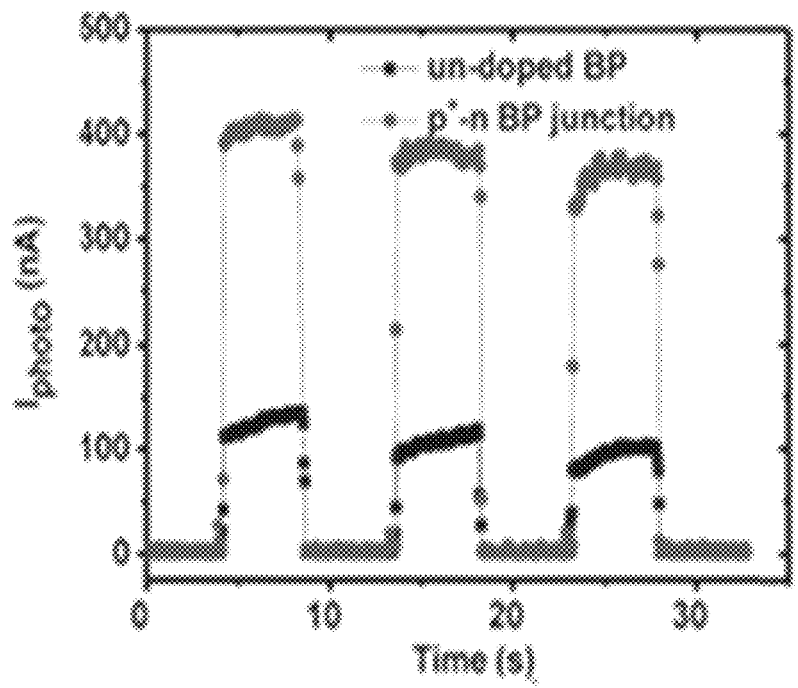

FIG. 4D and FIG. 4E show graphs of respectively photocurrent characteristics verse time for partial doped BP and un-doped BP at $V_D$=0.1 V and $V_g$=0 V and 65 V respectively at 655 nm wavelength laser. It could be confirmed referring to these graphs that the rise time (0.03 s) and the fall time (0.05 s) as observed for the horizontal BP junction devices were faster respectively by 1 order of magnitude than the rise and fall times (0.2 s and 0.15 s) as measured for the non-doped BP devices. This significant improvement in the response time is due to the higher carrier density and the internal potential created inside the junction devices.

Figure 4F:
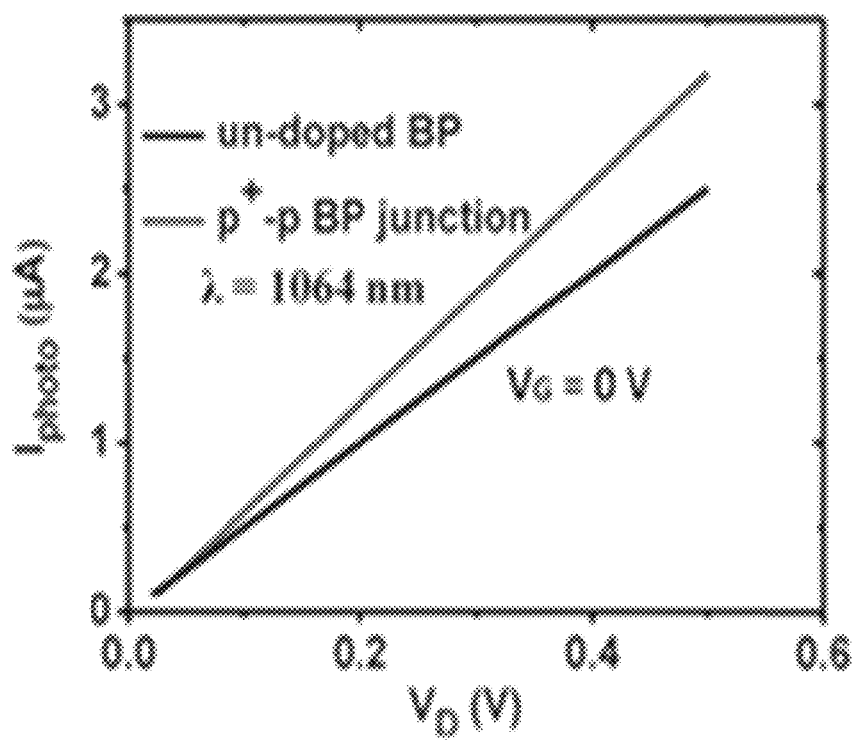
Figure 4G:
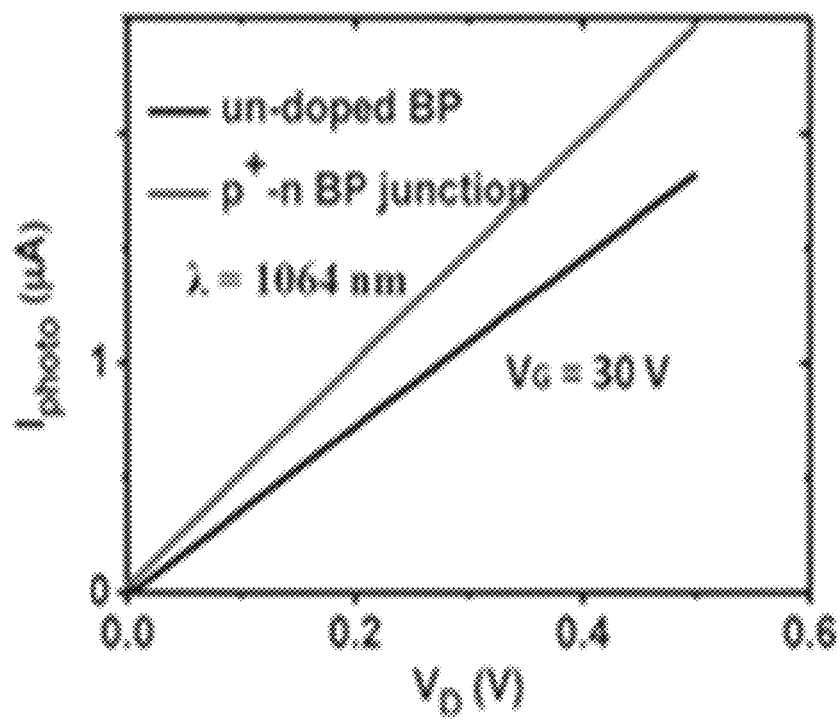

FIG. 4F and FIG. 4G show graphs of respectively $I_{photo}$-$V_D$ characteristic for partial doped BP and un-doped BP at $V_g$=0 V and 30 V respectively at 1065 nm wavelength laser. It could be confirmed referring to these graphs that the optical response in the IR band region is also improved as in in FIGS. 4 (b) and (c).

Consideration on Evaluation Result of Optical Characteristic

The results shown in FIGS. 4A to 4G above suggest that the output characteristic of the present BP device under light irradiation conditions is useful for wide band optical applications, particularly, IR photoelectric applications. In this connection, 2D semiconductor material (for example, TMDC material) is known to be useful for IR photoelectric devices. The photocurrent values as measured under IR irradiation suggests that the $P^+$-P junction and the $P^+$-N junction are more advantageous than the non-doped BP channel. Photocurrents of 3.2 μA and 2.5 μA could be achieved for $V_D$=0.5 V for the $P^+$-P junction and the $P^+$-N junction, which was observed in the case of red light illumination.

In this connection, calculating external quantum efficiency (EQE) and optical responsiveness (R) may allow the optical performance of the $P^+$-P junction and the $P^+$-N junction in BP to be numerically evaluated. An EQE value of 24000% was obtained at $V_D$=1 V and $V_G$=+30V (for the $P^+$-N junction). R is substantially three times the value as obtained for the non-doped BP-based optical transistor. R was 120 A/W which is much higher than the value as measured from recently reported BP P-N junctions.

Previous papers on photo-resistors have reported that a very high EQE or R is obtained at high $V_G$ and $V_D$, resulting in the generation of additional thermionic charges that promote generation of carriers via light. The internal potential of the $P^+$-P junction and $P^+$-N junction according to the present disclosure may provide exceptional advantages that it enables isolation and collection of optical carriers even at low $V_D$ and zero $V_G$. This may be suitable for low power light sensing applications.

Further, filling factor (FF) and light conversion efficiency (η) were respectively estimated to be 0.2 and 4.8% for the $P^+$-P junction. The filling factor (FF) and light conversion efficiency (η) were estimated to be 0.4 and 5.4% for the $P^+$-N junction, respectively. The related experimental results suggest that the effect of the present disclosure is to improve the responsiveness and response rate of the optical device, and/or that the effect of this disclosure is that the operation of the low power optical device may be implemented using the partial doping onto a single channel BP.

Characteristic Evaluation of $P^+$-$N^+$ Junction Structure

A device having a $P^+$-$N^+$ junction structure was prepared in which the BP single channel is divided into a $P^+$ region defined via electrostatic doping using the ionic liquid together with applying a high and positive gate voltage, and a $N^+$ region defined via gating. For the device with $P^+$-$N^+$ junction structure, the $I_D$-$V_D$ curve was obtained to evaluate the negative differential resistance (NDR) transfer behavior characteristic.

Figure 5A:
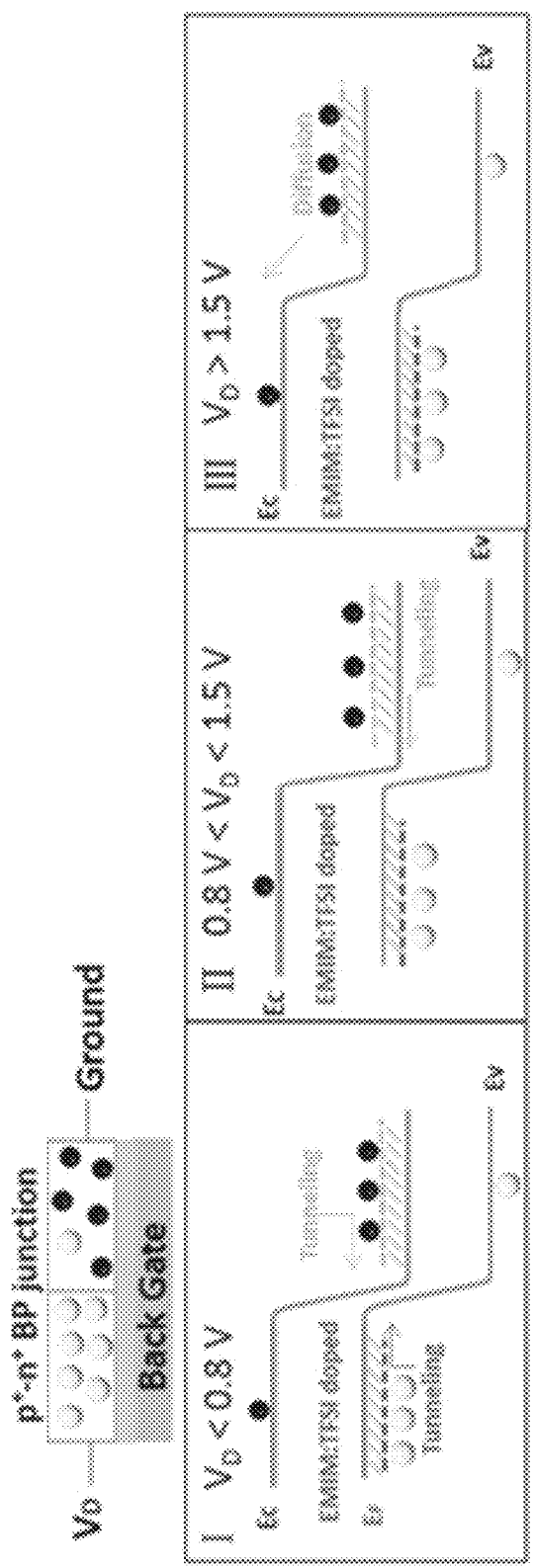
FIGS. 5A to 5C are illustrations of characteristics of a hetero-junction structure of a channel layer of a black phosphorous-based electronic device according to one embodiment of the present disclosure.
Figure 5B:
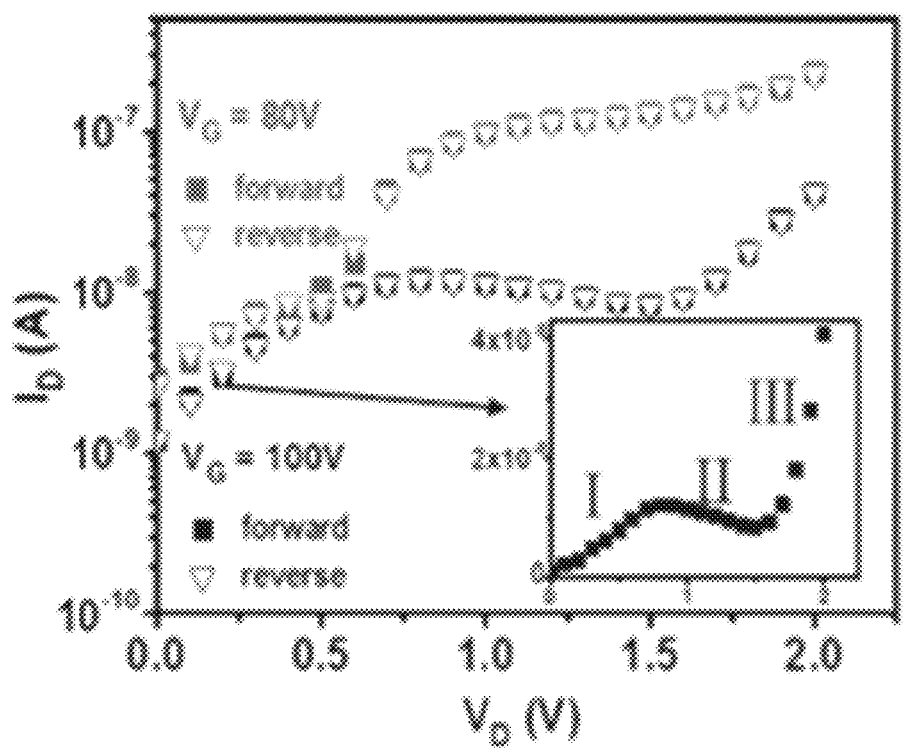
Figure 5C:
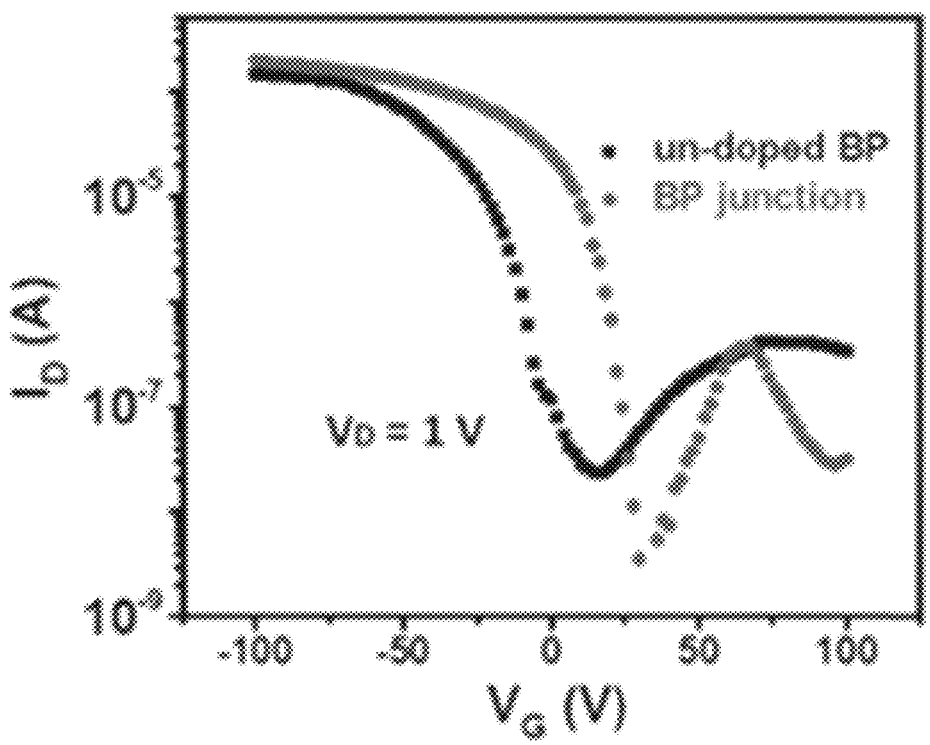

FIGS. 5A to 5C illustrate characteristics of a heterojunction structure of a channel layer of a black phosphorous-based electronic device according to one embodiment of the present disclosure.

FIG. 5A shows on the device with $P^+$-$N^+$ junction structure and the energy band diagram thereof based on $V_D$; FIG. 5B shows an $I_D$-$V_D$ characteristic graph when $V_g$=80 V (red graph) and $V_g$=100 V (black graph); FIG. 5C shows an $I_D$-$V_g$ characteristic graph of the BP junction FET before and after electrostatic doping.

Referring to FIGS. 5A to 5C, for I of FIG. 5A, under a low forward bias (0<$V_D$<0.8 V) condition, electrons may move from an n$^+$ region through a common energy window ($E_{FN}^+$-$E_{FP}^+$) to an empty energy level of the p$^+$ region via tunneling through a barrier. The tunneling current increased mainly because the available joint DOS (density of states) for conduction increased with the increase of the bias voltage (I∝DOS$_P$, DOS$_N$). The peak current was obtained when the joint DOS is at its maximum.

Referring to FIGS. 5A to 5C, for II of FIG. 5A, when the forward bias voltage is further increased (0.8V<$V_D$<1.5V), the common energies (i.e., joint DOS) for both bands are reduced, which results in a reduction of the tunneling current. As the entire DOS approaches zero, the junction current has reached its minimum value. At $V_D$=1.5V, the bottom of the n$^+$ region conduction band is positioned above the p$^+$ region balance band. Thus, at this voltage, there is no available DOS for conduction, so that tunneling is not allowed and no current flows.

Further, referring to FIGS. 5A to 5C, for III of FIG. 5A, as the $V_D$ is further increased ($V_D$>1.5V), the common diffusion current and thermionic emission current increase with $V_D$ increase as the energy barrier between the conduction bands of the p⁺ region and n⁺ region decreases. Thus, the current increased in the horizontal BP P⁺-N⁺ junction as the $V_D$ increased.

As shown in FIG. 5B, the NDR characteristic of the BP horizontal P⁺-N⁺ junction was observed to start at $V_G$=+80V. The NDR characteristic was clearly observed from the output characteristic measured at $V^G$=+100V. Significant hysteretic behavior was not observed from the forward sweep (0->2V) and the reverse sweep (2->0V). This is the first proof of NDR transfer induced by tunneling in the single BP channel. The ratio of peak to valley thus obtained was about 2 at room temperature. This value is higher than the value obtained from 2D heterojunction structures such as $BP/SnSe_2$, $MoS_2/WSe_2$, and the like.

As shown in FIG. 5C, the $I_D$-$V_G$ characteristic of the uniform horizontal BP junction field effect transistor has been studied and compared with the non-doped BP channel device. Although the doped and un-doped field effect transistors all exhibit a hole-carrier-dominant transfer characteristic (a high $I_D$ at a negative value of $V_G$), the convex peak, that is, the local maximum of the current appears for the BP junction electric field effect transistor (red curve) at a positive $V_G$ (50V<$V_G$<95V) (the current first increases and then decreases as $V_G$ increases). This proves negative transconductance characteristics (NTC) ($dI_D/dV_G$<0). This NTC was observed even at room temperature. The observed NTC may be understood from the coupling effect selected from the diffusion current between the BP and the metal contact, the barrier formation in the junction, and the Schottky barrier ($\phi_{sc}$).

Although not shown in the figure, at a $V_G$ lower than 30V (P⁺-P junction), a typical hole-carrier-dominant $I_D$ curve was observed from the energy band diagram illustrating the NTC behavior in the $I_D$-$V_G$ curve at a positive $V_G$ value. This may confirm that $I_D$ decreases as $V_G$ increases. After reaching the minimum value at $V_G$=30V, the current increased as the gate voltage increased. We understand that the minimum current rises when the Fermi energy of the metal contact matches the middle level of the bandgap of the n-type BP. The Schottky barrier was highest at this point and the contact resistance was at its maximum at this point. As for $V_G$ values between 30V and 75V (the junction acts as basically a p⁺-n diode), as VG increases, the Schottky barrier between the semiconductor BP and the metal contact decreases, and the main current moves from the n⁻ doped BP region to the p⁺ BP region. Thus, The $I_D$ increases with the increase of the gate voltage. At $V_G$=70V, the $I_D$ reached the peak value, and then the current again decreased with the decrease of the gate voltage. For $V_G$ values in excess of 70V, the down turn of the $I_D$ occurs in the boundary region between P⁺ and N⁺ regions, and results from an improved barrier that suppresses the entire $I_D$. The barrier is proportional to the internal potential in the interface. The horizontal BP junction devices represent both NDR and NTC characteristics, which is crucial for further study of new types of 2D functional devices.

It has been confirm from the above that the ionic liquid together with adjustment of the concentration thereof may be used to change the hole-carrier carrier density from $10^{11}$ cm⁻² (un-degenerate level) to $10^{13}$ cm⁻² (degenerate level). Such an electrostatic doping method may be applied to manufacture a uniform multifunctional horizontal junction diode. It has been confirmed that electrostatic-doping of a portion of the BP sample and applying the gate voltage to the rest of the BP sample may allow uniform horizontal P⁺-P, P⁺-N and P⁺-N⁺ junction diodes to be fabricated in the single BP and thus allow an electrically adjustable p-n junction to be produced.

Further, the channel layer thus manufactured is not deteriorated even under the oxygen exposure condition, and is stably maintained, so that the stability of the device may be ensured.

The uniform horizontal P⁺-P and P⁺-N junctions exhibited ideal rectification behavior and stronger optical response due to their internal potential. These characteristics may be adjusted by adjusting the gate voltage. Open-circuit voltage and short-circuit current measurements have shown that horizontal BP p⁺-n diodes may be applied to solar cells.

Additionally, at high positive gate voltages, the diode acted as a p⁺-n⁺ diode. In this case, inter-band tunneling enabled the uniform horizontal p⁺-n⁺ junction providing NDR and NTC at a room temperature in terms of current-voltage characteristics. Further, the peak to valley ratio as obtained from the NDR characteristic $I_D$-$V_D$ curve reached about 2 at room temperature.

In other words, it is possible to manufacture multifunctional horizontal BP junctions (P⁺-P and P⁺-N and P⁺-N⁺ junctions) based on the single BP electric field effect transistor as prepared via partially electrostatic doping. The observation of the NDR and NTC characteristics from the BP P⁺-N⁺ junction-based electric field effect transistor may indicate that novel opportunities of BP-based devices for future low power high speed electromagnetic device applications may be discovered.

It is to be understood that while the present disclosure has been particularly shown and described with reference to the exemplary embodiments thereof, the disclosure is not limited to the disclosed exemplary embodiments. On the contrary, it will be understood by those skilled in the art that various modifications may be made without departing from the spirit and scope of the present disclosure.

It is understood by those skilled in the art that various variants and alternatives may be selected in the present disclosure without departing from the spirit or scope of the present disclosure. Accordingly, it is intended that the present disclosure covers the modifications and variations when they come within the scope of the appended claims and their equivalents.

In the present specification, a reference has been made to all the device and method disclosures. In this connection, the descriptions of the device and method disclosures may be applied to each other in a supplementing manner.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A multi-functional electronic device with a black phosphorous-based single channel, wherein the device comprises:
    a black phosphorous-based single channel layer including
        a horizontal arrangement of a first semiconductor region and a second semiconductor region to define a horizontal junction therebetween, wherein the second semiconductor region has a lower hole-carrier density than the first semiconductor region;

a first electrode connected to the first semiconductor region;

a second electrode spaced from the first electrode and connected to the second semiconductor region;

an ionic gel layer disposed on the first semiconductor region; and a gate electrode for receiving a gate voltage to generate an electric field in the channel layer.

2. The multi-functional electronic device of claim 1, wherein a hole-carrier density of the first semiconductor region is adjusted with doping to be in a range of $10^{11}$ cm$^{-2}$ to $10^{13}$ cm$^{-2}$.

3. The multi-functional electronic device of claim 1, wherein the higher a hole-carrier density of the first semiconductor region, the higher a concentration of an ionic compound in the ionic gel layer.

4. The multi-functional electronic device of claim 1, wherein the ionic gel layer has a structure in which an ionic compound is disposed in a matrix formed by a polymer compound.

5. The multi-functional electronic device of claim 4, wherein the polymer compound is PMMA (polymethyl methacrylate), wherein the ionic compound contained in the ionic gel layer is [1-ethyl-3-methylimidazolium bis(trifluoromethanesulfonyl) imide (EMIM:TFSI)].

6. The multi-functional electronic device of claim 1, wherein the first semiconductor region acts as a P$^+$ region, while the second semiconductor region acts as a P region, N region or N$^+$ region depending on gating of the gate electrode.

7. The multi-functional electronic device of claim 6, wherein the device acts as a P$^+$-P junction photodiode, wherein the first semiconductor region acts as a P$^+$ region while the second semiconductor region acts as a P region; or wherein the device acts as a P$^+$-N junction photodiode, wherein the first semiconductor region acts as a P$^+$ region while the second semiconductor region acts as a N region.

8. The multi-functional electronic device of claim 6, wherein the device acts as a tunneling device exhibiting negative differential resistance (NDR) characteristic at a room temperature, wherein the first semiconductor region acts as a P$^+$ region while the second semiconductor region acts as a N$^+$ region.

9. A method for manufacturing a multi-functional electronic device with a black phosphorous-based single channel, wherein the electronic device includes a channel layer, two electrodes spaced apart from the channel layer, and a gate electrode for generating an electric field in the channel layer, wherein the method comprises forming the channel layer, wherein forming the channel layer includes:

forming a black phosphorous layer;

disposing a mask pattern on a first region of the black phosphorous layer; and applying a mixture containing an ionic compound on a second region of the black phosphorous layer not covered by the mask pattern, thereby to electrostatically-dope the ionic compound onto the second region of the black phosphorous layer.

10. The method of claim 9, wherein the electrostatically-doping is carried out such that the first region acts as a first semiconductor region while the second region acts as a second semiconductor region, wherein the second semiconductor region has a higher hole-carrier density than the first semiconductor region.

11. The method of claim 10, wherein the electrostatically-doping is carried out such that an ionic gel layer containing the ionic compound is formed on the second semiconductor region.

12. The method of claim 9, wherein the ionic compound is [1-ethyl-3-methylimidazolium bis(trifluoromethanesulfonyl) imide (EMIM:TFSI)], wherein the mixture further contains polymethyl methacrylate (PMMA), wherein the PMMA is mixed with the ionic compound to form the mixture.

13. The method of claim 9, wherein the electrostatically-doping is carried out to define an electrostatically-doped black phosphorous layer with a hole-carrier density in a range of $10^{11}$ cm$^{-2}$ to $10^{13}$ cm$^{-2}$.

14. The method of claim 9, wherein the electrostatically-doping includes:

forming an electric double layer and a trap site by allowing the ionic compound in the mixture to be absorbed on a surface of the black phosphorous layer; and inducing charge accumulation in an interface between the mixture and the black phosphorous layer.

15. The method of claim 9, wherein the mask pattern is made of polymethyl methacrylate (PMMA).

16. The method of claim 9, wherein the electrostatically-doping is carried out such that as a concentration of the ionic compound in the mixture increases, a hole-carrier concentration on the second region increases.

* * * * *